United States Patent
Hattori

(10) Patent No.: US 9,280,045 B2
(45) Date of Patent: Mar. 8, 2016

(54) MASK BLANK AND PHOTOMASK

(71) Applicant: CLEAN SURFACE TECHNOLOGY CO., Kanagawa (JP)

(72) Inventor: Isao Hattori, Kanagawa (JP)

(73) Assignee: CLEAN SURFACE TECHNOLOGY CO., Kanagawa (JP)

(*) Notice: Subject to any disclaimer, the term of this patent is extended or adjusted under 35 U.S.C. 154(b) by 78 days.

(21) Appl. No.: 14/054,395

(22) Filed: Oct. 15, 2013

(65) Prior Publication Data

US 2014/0106266 A1    Apr. 17, 2014

(30) Foreign Application Priority Data

Oct. 15, 2012 (JP) ................................ 2012-228448

(51) Int. Cl.
*G03F 1/40* (2012.01)
*G03F 1/48* (2012.01)

(52) U.S. Cl.
CPC ........................................ *G03F 1/40* (2013.01)

(58) Field of Classification Search
CPC .................................... G03F 1/40; G03F 1/48
USPC ............................................................. 430/5
See application file for complete search history.

(56) References Cited

U.S. PATENT DOCUMENTS

2006/0154153 A1* 7/2006 Chiang et al. ...................... 430/5
2014/0295330 A1* 10/2014 Pruneri et al. ..................... 430/5

FOREIGN PATENT DOCUMENTS

| JP | 57-182741 A | 11/1982 |
| JP | 06-289592 A | 10/1994 |
| JP | 07-098493 A | 4/1995 |
| JP | 07-261375 A | 10/1995 |
| JP | 2008-241921 A | 10/2008 |

OTHER PUBLICATIONS

Office Action issued in counterpart Japanese application 2012-228448 on Oct. 22, 2013 (no translation available).

* cited by examiner

*Primary Examiner* — Stephen Rosasco
(74) *Attorney, Agent, or Firm* — Griffin and Szipl PC

(57) ABSTRACT

The present invention is to provide a mask blank enabling fabrication of a photomask having a structure where electrostatic breakdown is effectively prevented. To accomplish the object, the invention discloses a mask blank comprising a mask substrate, an electrostatic breakdown prevention film fully covering one side of the mask substrate, and a shading film formed on the electrostatic breakdown prevention film. The electrostatic breakdown prevention film is made of titanium, tantalum, titanium compound or tantalum compound. The transparent rate of the electrostatic breakdown prevention film is not less than 75%, for the wavelength of light in an exposure. The sheet resistance of the electrostatic discharge prevention film is not more than 100KΩ/□.

14 Claims, 6 Drawing Sheets

MASK BLANK AND PHOTOMASK

This application claims priority from Japanese Patent Application No. 2012-228448, filed Oct. 15, 2012, the entire disclosure of which is incorporated herein by reference.

FIELD OF THE INVENTION

This invention relates to a photomask used in photolithography, especially to a mask blank as base for fabricating a photomask.

BACKGROUND OF THE INVENTION

The art of photolithography forming a fine pattern on a substrate is often utilized in manufacturing kinds of semiconductor devices and display devices. In photolithography, photoresist is coated on a substrate, which is hereinafter called "circuit substrate". The photoresist is exposed to light of a circuit pattern. Then the circuit pattern is transferred by carrying out development of the photoresist and etching through the developed photoresist.

The photomask as master piece has the structure where the circuit pattern is formed on a transparent substrate, hereinafter called "mask substrate" for discrimination from circuit substrates. Photomasks are fabricated from products called "mask blanks". A mask blank is fabricated by fully covering one side of a mask substrate with a shading film.

In photolithography, the problem of the photomask charge-up has been arising. Although the shading film, which may be chrome film or chrome compound film, in a photomask is conductive, the mask substrate is made of glass, i.e., dielectric, which can be easily charged up. Especially, when a photomask is used for so-called contact exposure, it can be charged up easily because it is contacted onto a circuit substrate. The charge up can happen when the photomask is detached from the circuit substrate after the exposure, i.e., so-called "contact-and-separation charge-up".

When too much static electricity is induced on a photomask, discharge, i.e., insulation breakdown, would take place by any cause. For example, the shading film pattern on the mask substrate may have a part of "island", that is, a part completely isolated from other parts. Potential at this island part could be much different form the other parts as result of that the photomask is charged up. When the potential difference is enlarged, a discharge may take place along the surface of the mask substrate. Otherwise, a discharge may take place between the mask substrate and an element located nearby or during maintenance.

One of problems caused by the photomask gaining charge is deformation of the shading film pattern. For example, the shading film pattern could be chipped off by impact of a discharge. Deformation of the pattern could cause decrease of the yield rate, because it is transferred to a circuit substrate.

A discharge by an excessive charge-up tends to take place at a keen part of a shading film (conductive film) pattern, e.g., right angle corner. Rounding the corner helps to prevent the discharge and could be the solution for this. However, such transformation (rounding) of the pattern is in many cases prohibited because it is the master fine pattern to be transferred to a circuit substrate.

As a structure preventing the photomask charge-up, it is considered that an ITO (indium tin oxide) film, which is the transparent conductive film, is formed on a mask substrate, and a shading film is patterned thereon. This structure is disclosed in JP2008-241921-A1. However, ITO films have only low tolerances against etchant liquids in patterning shading films. This brings the problem that an ITO film is made thinner through etching by the etchant. Otherwise, the tolerance against the cleaner liquid in a cleaning step could be questioned. When an ITO film is made thinner by chemicals, the sheet resistance thereof increases because of the volume reduction, and then could lose the required grounding function.

SUMMARY OF THE INVENTION

The present invention was made in consideration of the above described points. The object of the invention is to provide a mask blank enabling fabrication of a photomask having a structure where the electrostatic breakdown is effectively prevented. To accomplish the object, the invention provides a mask blank comprising a mask substrate, an electrostatic breakdown prevention film fully covering one side of the mask substrate, and a shading film formed on the electrostatic breakdown prevention film. The electrostatic breakdown prevention film is made of titanium or tantalum. The transparent rate of the electrostatic breakdown prevention film is not less than 75%, for the wavelength of light in an exposure. The sheet resistance of the electrostatic discharge prevention film is not more than $100K\Omega/\square$ (the units $\Omega/\square$, expressed in $\Omega$ can also be written $\Omega/sq.$).

To accomplish the object, the invention also provides a mask blank comprising the electrostatic breakdown prevention film made of titanium compound or tantalum compound. The transparent rate of the electrostatic breakdown prevention film is not less than 75%, for the wavelength of light in an exposure either. The sheet resistance of the electrostatic discharge prevention film is not more than $100K \Omega/\square$ $\square$ either.

EMBODIMENT

Figure 1:
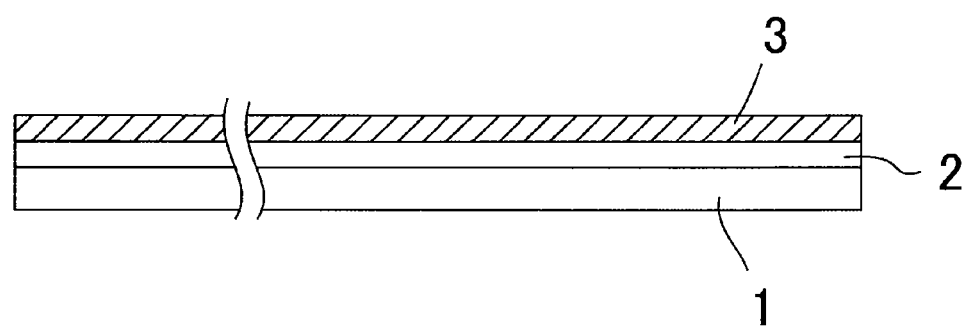
FIG. 1 is a schematic front cross sectional view of a mask blank as an embodiment.

An embodiment of the invention will be described as follows. FIG. 1 is a schematic front cross sectional view of a mask blank as the embodiment. The mask blank shown in FIG. 1 comprises a transparent mask substrate 1, an electrostatic breakdown prevention film 2 formed on the mask substrate 1, and a shading film 3 formed on the electrostatic breakdown prevention film 2.

The mask substrate 1 is made of glass such as quartz, which is well transparent to an exposure light wavelength. The mask substrate 1 is in many cases rectangular shaped. Its size depends on a photomask to fabricate. The thickness of the mask substrate 1 may be in the range of 1.5 to 17 mm.

The electrostatic breakdown prevention film 2 is made of titanium, titanium compound, tantalum or tantalum compound. The titanium compound may be titanium oxide, titanium nitride, titanium oxynitride or the like. As well, the tantalum compound may be tantalum oxide, tantalum nitride, tantalum oxynitride or the like. When a film of such material is formed fully covering one side of the mask substrate 1, it works as the electrostatic breakdown prevention film 2. The thickness of the electrostatic breakdown prevention film 2 may be in the range of 1.5 to 3.5 nm. As the shading film 3, a film of chrome or chrome compound is formed as described. The thickness of the shading film 3 may be in the range of 90 to 150 nm.

Figure 2:
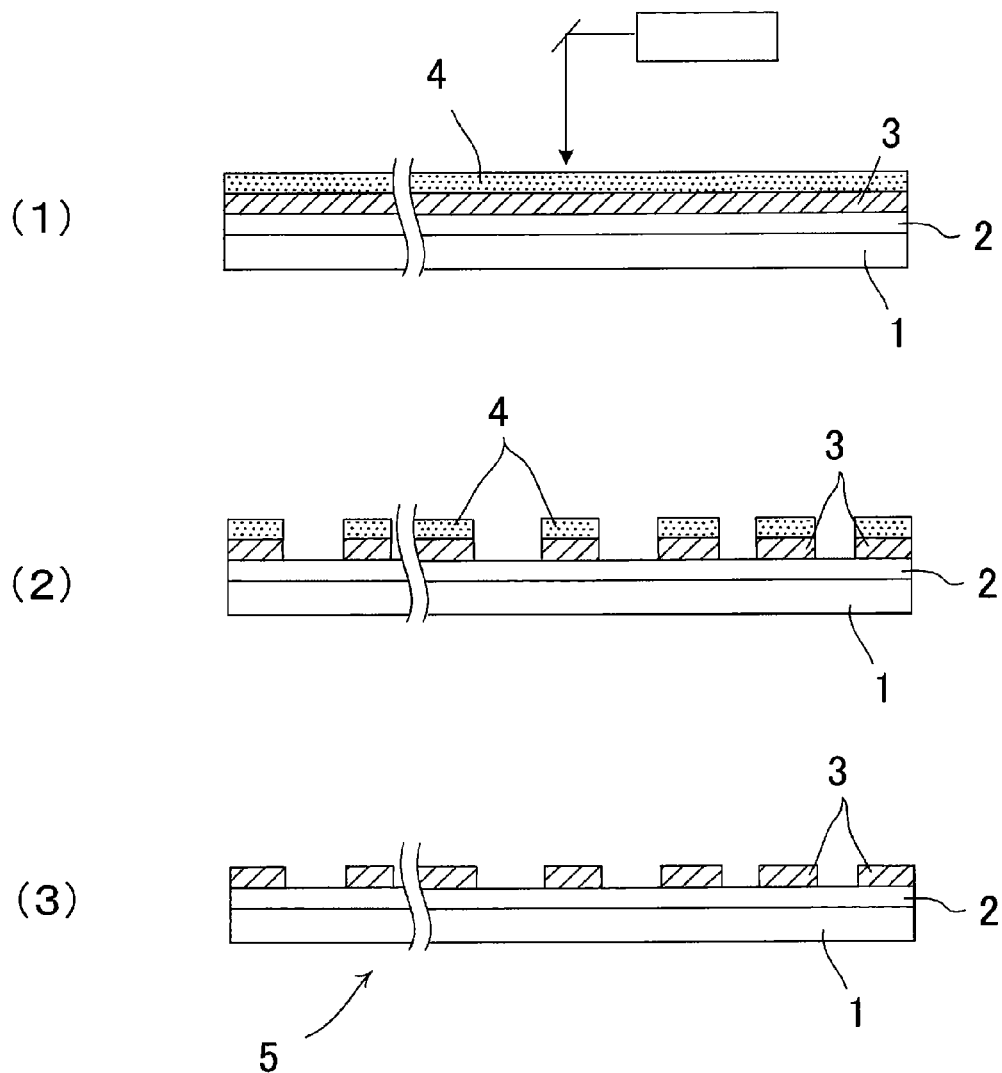
FIG. 2 is a schematic front cross sectional view showing a method for fabricating a photomask from the mask blank shown in FIG. 1.

FIG. 2 is a schematic front cross sectional view showing a method for fabricating a photomask from the mask blank shown in FIG. 1. As shown in FIG. 2, fabrication of the photomask starts with coating photoresist 4 over the whole surface area of the mask blank. The photoresist 4 is exposed to a light pattern such as laser drawing pattern (FIG. 2 (1)). After developing the photoresist and making a pattern thereby, the shading film 3 is etched by an etchant liquid (FIG. 2 (2)). After the etching, the photoresist 4 is removed by ashing. After carrying out a cleaning step by a cleaner liquid and another required step, the photomask 5 is completed (FIG. 2 (3)).

Figure 3:
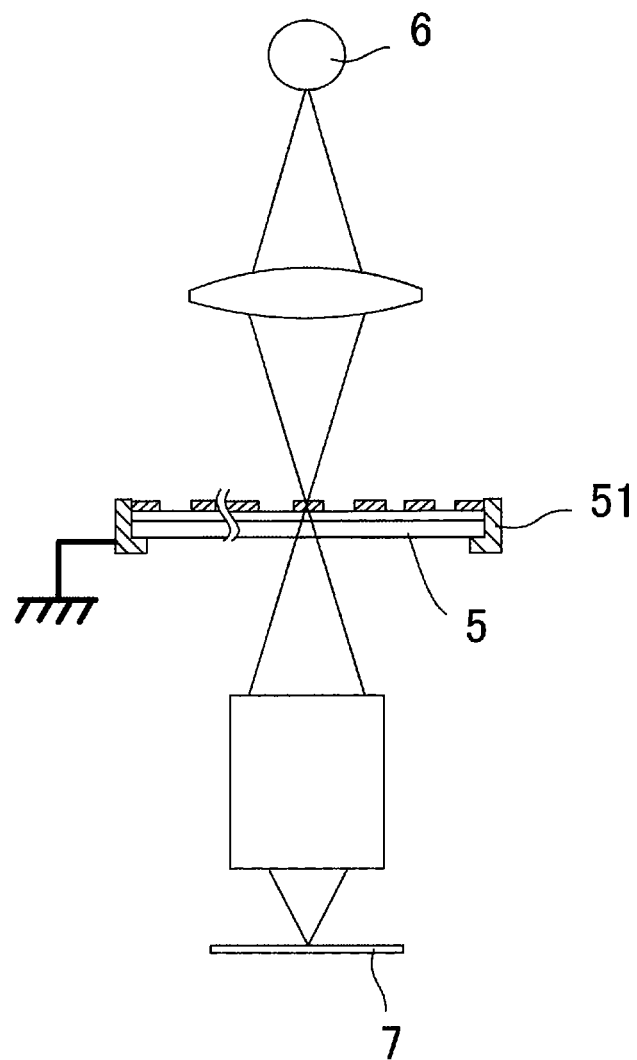
FIG. 3 is a schematic front view of an exposure system in which the photomask is mounted.

FIG. 3 is a schematic front view of an exposure system in which the photomask 5 is mounted. As shown in FIG. 3, the photomask 5 is aligned at a required position through which the light from a light source 6 is irradiated on a circuit substrate 7. The photomask 5 is held by a mask holder 51 and keeps the required position. The portion of the mask holder 51 contacting with the photomask 5 is metallic and grounded as shown in FIG. 3.

On the other hand, the fabricated photomask 5 has the structure where the electrostatic breakdown prevention film 2 is provided at the whole interface between the mask substrate 1 and the patterned shading film 3. The mask holder 51 contacts with an edge of the electrostatic breakdown prevention film 2 and is in the grounded state. Accordingly, the electrostatic breakdown prevention film 2 is also in a grounded state. As a result, the charge-up of the photomask 5 is prevented, and any electrostatic breakdown as described cannot take place.

Although the exposure system shown in FIG. 3 is a projection type, a photomask may be mounted at a required position relating to a circuit substrate in a proximity type or contact type exposure system. The mounted photomask may be held by a holder, otherwise the photomask may be held by a member of a mounting mechanism. Such a member is often metallic and can prevent the electrostatic breakdown as well when it is grounded. Even if the photomask is isolated from the ground during an exposure, it can be grounded in mounting or demounting. Otherwise, by making a metallic portion of a storage rack grounded and making the photomask contact thereto, the electrostatic breakdown prevention film 2 is also grounded.

In the described mask blank and photomask of this embodiment, the electrostatic breakdown prevention film 2 must have the conductivity high enough to prevent the electrostatic breakdown. The required conductivity may differ depending on the incidence of the photomask charge-up. Although the incidence of the photomask charge-up may differ depending on the use environment of the photomask, the patter configuration of the shading film 3 and other factors, generally a photomask having the sheet conductivity not more than 100KΩ/□ can be used practically without any problem.

The thickness of the electrostatic breakdown prevention film 2 is significant with respect to obtaining a required transparency. Titanium and tantalum have poor transparency to exposure light wavelengths, and titanium compound and tantalum compound are the same in many cases. Therefore, if a mask substrate is fully covered by a film of such material, presumably the transparency required as photomask would not be obtained, making it practically unusable. It is considered the reason why titanium and tantalum have not been used as materials of electrostatic breakdown prevention films in photomasks would be from the above presumption. In a research by the inventor, however, it has turned out that a film made thinner to some extent does not deteriorate the transparency as well as accomplishes the purpose of the electrostatic breakdown prevention.

Figure 4:
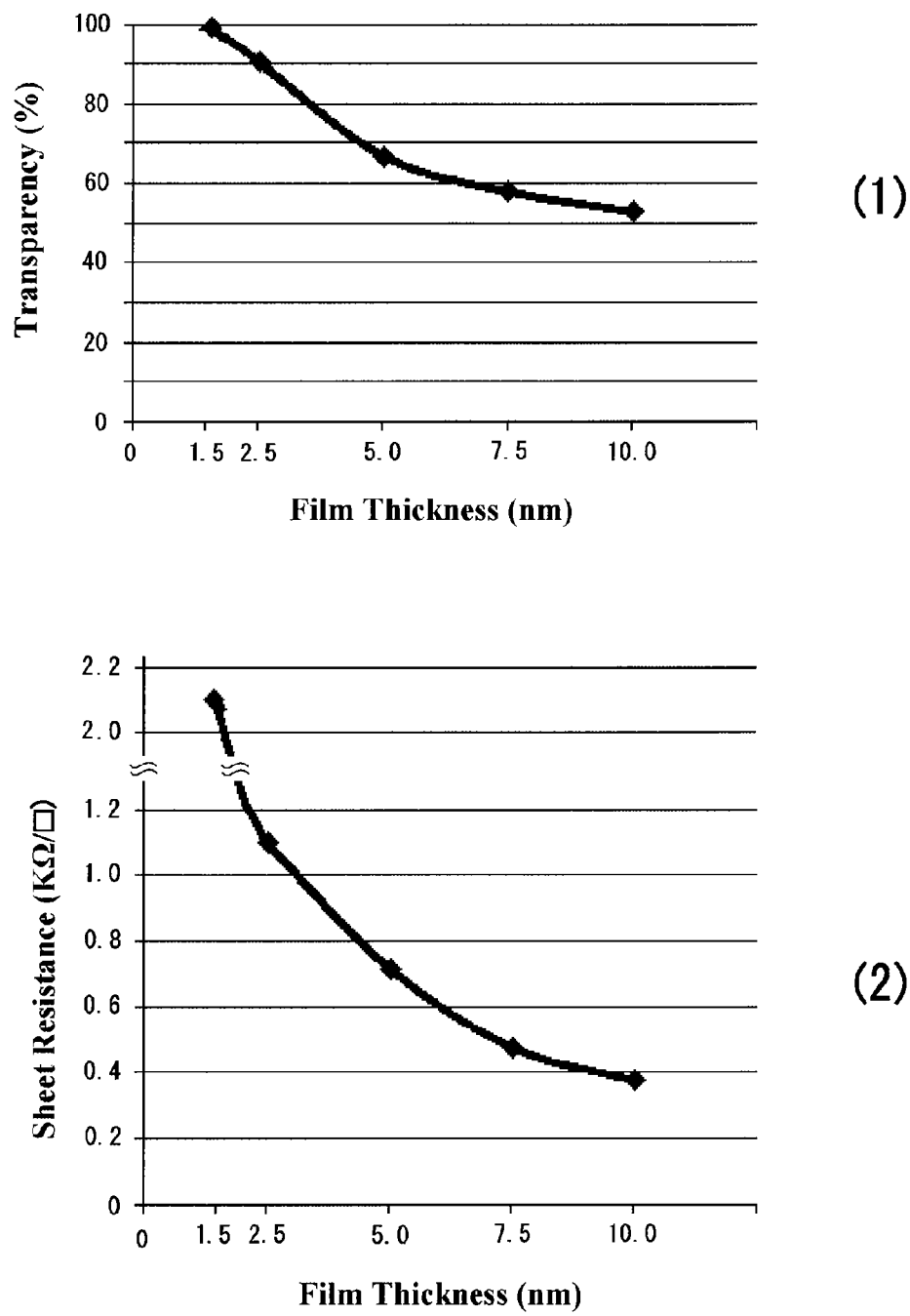
FIG. 4 shows the result of an experiment to investigate relations of the transparency and the sheet resistance both to the thicknesses of the electrostatic breakdown prevention films.

FIG. 4 shows the result of an experiment to investigate relations of the transparency and the sheet resistance both to thicknesses of electrostatic breakdown prevention films. In this experiment, titanium films of different thickness are formed as electrostatic breakdown prevention films. For each titanium film, the transparency and the sheet resistance both for g-line (436 nm) were measured. The transparency in each thickness is shown in FIG. 4 (1), and the sheet resistance in each thickness is shown in FIG. 4 (2). Each electrostatic breakdown prevention film (titanium film) was deposited by sputtering, where argon was used as the sputter gas.

As shown in FIG. 4 (1), although the transparency decreases as the thickness increases, the transparency not less than 75%, which is generally required, is obtained under the thickness not more than about 3.5 nm, e.g., 1.5 to 3.5 nm. In the films of larger thicknesses, the sheet resistance increases because of lesser volume of titanium layers. As shown in FIG. 4 (2), however, it is still, for example, 0.9 to 2.1 KΩ/□ □ even if the thickness decreases to about 1.5 to 3.5 nm, demonstrating the well conductivity for the preventing the electrostatic breakdown.

It was also confirmed that the electrostatic breakdown prevention films made thinner even at about 1.5 to 3.5 nm have the high tolerance against an etchant liquid. High tolerance means that films are free from the problem that the sheet resistance increases over an allowable value by the erosion during an etching. In other words, the advantage of titanium, that is, high chemical stability and high tolerance against erosive materials, enables to reduce the thickness of the film to a range where the transparency is not impeded, compensating the disadvantage of the low transparency in comparison to ITO and working much more. The inventor confirmed that this property is the same as tantalum, titanium compound and tantalum compound.

To obtain the effect of the electrostatic breakdown prevention for a long-enough period, the electrostatic breakdown prevention film 2 keeps the high conductivity for the long-enough period. Regarding this point, it has turned out in the inventor's research that an improvement in forming the electrostatic breakdown prevention film 2 is effective. Following is the description about this.

Although titanium and tantalum are the highly conductive materials, those may be oxidized to lose the conductivity by elapse of time. This is the same when those form the electrostatic breakdown prevention films 2. The films may be oxidized to lose conductivity, resulting in that the electrostatic breakdown prevention property might be affected. This problem is solved by applying an improvement in the forming step of the electrostatic breakdown prevention film 2. The improvement is to form the film by sputtering, and therein to use argon with oxygen added, argon with oxygen and nitrogen added, or argon with carbon dioxide and nitrogen added as the sputtering gas.

Figure 5:
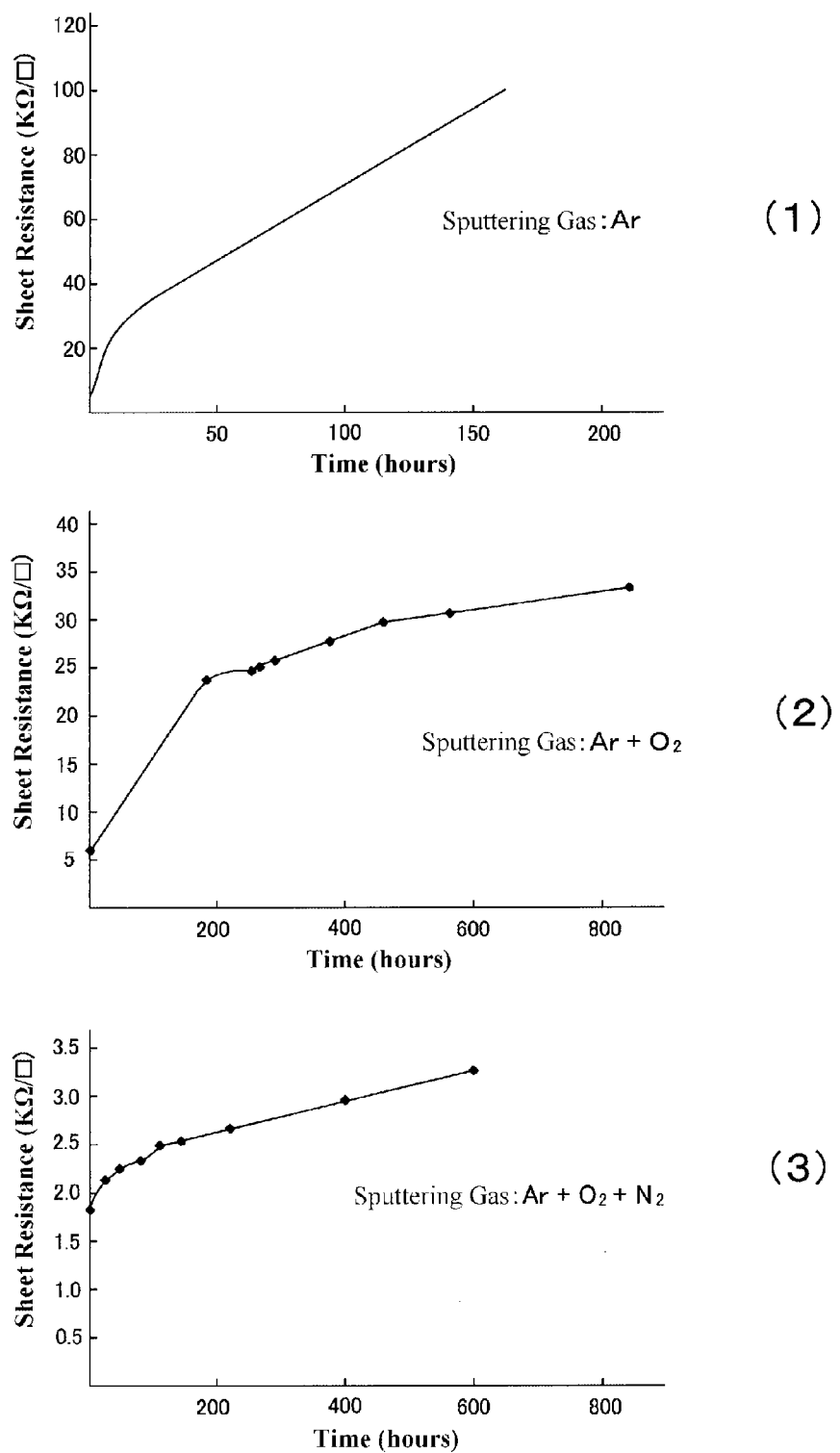
FIG. 5 shows the result of an experiment where the effects by oxygen gas addition and nitrogen gas addition were confirmed.

FIG. 5 shows the result of an experiment where the effects by oxygen gas addition and nitrogen gas addition were confirmed. In the experience shown in FIG. 5, the time-progressively changes of the sheet resistances of three samples were measured. The first sample is an electrostatic breakdown prevention film formed using argon with oxygen added as the sputtering gas. The second sample is an electrostatic breakdown prevention film formed using argon with nitrogen added as the sputtering gas. The third sample is an electrostatic breakdown prevention film formed using argon with oxygen and nitrogen added as the sputtering gas. FIG. 5 (1) shows the result for the first sample, FIG. 5 (2) shows the result for the second sample, and FIG. 5 (3) shows the result for the third sample.

In any sample, pressure (total pressure) was 0.20 Pa during the sputtering. Oxygen was added at 10% (flow rate) to argon in the sample shown in FIG. 5 (2). To argon, oxygen was added at 10%, and nitrogen was added 5%, in the sample shown in FIG. 5 (3). The mask substrates were of quartz. The thicknesses of the films were about 1 nm in the first sample, and about 2.5 nm in the second and third samples respectively.

As shown in FIG. 5 (1), the electrostatic breakdown prevention film deposited using argon only has the sheet resistance of 10KΩ/□ □ initially. However, it increased subsequently and reached to about 100KΩ/□ □ when 150 hours had passed. As shown in FIG. 5 (2), contrarily, the sheet resistance of the electrostatic breakdown prevention film deposited using argon with oxygen added was as low as 6KΩ/□ initially, and increased only to 24KΩ/□ when 200 hours have passed. Subsequently it increased moderately to as low as 35KΩ/□ even when 850 hours had passed. Also as shown in FIG. 5 (3), the sheet resistance of the electrostatic breakdown prevention film deposited using argon with oxygen and nitrogen added was only 1.4KΩ/□ initially, and increased just as low as 3.2 KΩ/□ when 600 hours had passed.

Figure 6:
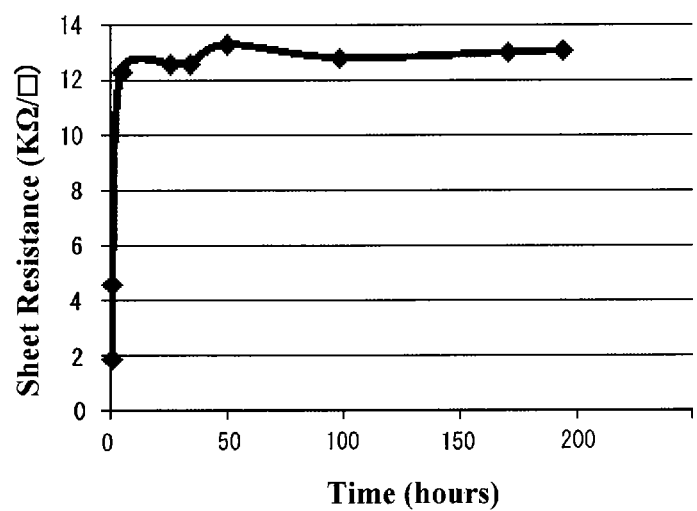
FIG. 6 shows the result of an experiment where the effect by addition of carbon dioxide gas and nitrogen gas was confirmed.

FIG. 6 shows the result of an experiment where the effect by addition of carbon dioxide gas and nitrogen gas was confirmed. In the experiment shown in FIG. 6, the time-progressively change of the sheet resistance of a sample was measured. The sample was an electrostatic breakdown prevention films deposited using argon with carbon dioxide gas and nitrogen gas added as the sputtering gas. As well, the film was formed by the sputter deposition using a titanium target under pressure of about 0.20 Pa. To argon, carbon dioxide gas was added at 10% flow rate, and carbon dioxide was 5% flow rage, respectively. The thickness of the deposited film was about 2.5 nm as well.

As shown in FIG. 6, the sheet resistance of the electrostatic breakdown prevention film was only 1.8KΩ/□ initially. Although it was up to about 12KΩ/□ in 24 hours, subsequently almost no increase was recognized even when 200 hours had passed. Probably the sheet resistance would stay at such a very low value ever since.

As in those results, by adding oxygen to argon, adding oxygen and nitrogen to argon or adding carbon dioxide and nitrogen to argon in deposing the electrostatic breakdown prevention film 2, the film has the good property where the initial high conductivity is not lost as time passes. The sheet resistance of 100KΩ/□ is a criterion for the electrostatic breakdown prevention. The photomask with the electrostatic breakdown prevention film disposed using only argon must be replaced in about 150 hours. By contrast, if it is deposed using argon with oxygen added, it would take, by calculation, about six months until the sheet resistance increases to 100KΩ/□. Or if it is deposited using argon with oxygen and nitrogen added, it would take more than several years to 100KΩ/□. Practically no replacement is required. This is the same when the film is deposited using argon with carbon dioxide and nitrogen added. As described, although the electrostatic breakdown prevention effect is obtained in any cases, the effective period is extended to reduce the replacement frequency, by adding oxygen to argon, adding oxygen and nitrogen to argon or adding carbon dioxide and nitrogen to argon in the film deposition.

After replacement, the used photomask is destaticized and then able to be re-used. Otherwise, if it can be destaticized as held by the holder 51 in the exposure system, destaticization maintenances may be carried out periodically thereon. In this case, the lesser frequent maintenances are required for the photomask comprising the electrostatic breakdown prevention film 2 deposited using argon with oxygen added, argon with oxygen and nitrogen added, or argon with carbon dioxide and nitrogen added. This contributes to enhancement of the productivity.

Describing the transparency of the electrostatic breakdown prevention films 2 deposited in the experiment shown in FIG. 5, it was 95% at g-line (436 nm), 94.7% at h-line (405 nm) and 93.3% at i-line (365 nm) respectively for the electrostatic breakdown prevention film 2 deposited using only argon. For the electrostatic breakdown prevention film 2 deposited using argon with oxygen added, the transparency was 92.6% at g-line, 91.9% at h-line and 90.4% at i-line respectively. For the electrostatic breakdown prevention film 2 deposited using argon with oxygen and nitrogen added, the transparency was 89.5% at g-line, 88.4% at h-line and 86.4% at i-line respectively. The transparency not less than 75% is required generally. Each case exceeds this value, demonstrating no problem for practical use.

It has not been clarified the reason why the electrostatic breakdown prevention film 2 deposited using argon with oxygen added, argon with oxygen and nitrogen added or argon with carbon dioxide and nitrogen added keeps the high conductivity for a long period. But, the following presumption would be possible.

Titanium oxide and tantalum oxide are the dielectric materials. When a titanium or tantalum target is sputtered to deposit a titanium film or tantalum film as oxygen is added to argon as the sputtering gas, a normal titanium oxide film or normal tantalum oxide film would not be deposited. Supposedly the film would have the structure where small amount of oxygen is incorporated within a titanium or tantalum layer. Otherwise, because the film is amorphous, it could have a structure different from a crystal layer of titanium oxide or tantalum oxide even if titanium oxide or tantalum oxide is formed. This would be the reason the passivation effect by the oxygen incorporation is obtained without losing the enhanced conductivity for a long period. When oxygen gas and nitrogen gas are added, or when carbon dioxide gas and nitrogen gas are added, partial nitridization or nitrogen incorporation in the titanium or tantalum layer would sustain the passivation effect and the conductivity enhancement for a longer period. A film deposited using argon with oxygen or nitrogen added can be discriminated from another film deposited using only argon, because oxygen or nitrogen is incorporated therein.

The mask blank of this embodiment, as described, can prevent the photomask from charge up because it has the structure where the shading film 3 is formed on the film 2 of titanium, tantalum or compound thereof which fully covers the mask substrate 1. Accordingly, the photomask does not suffer any electrostatic discharge impacts causing patter deformations. Therefore, it is free from accidents reducing the yield rate.

The thickness of the electrostatic breakdown prevention film 2 can be thinner enough to obtain a required transparency without losing the chemical tolerance during an etching. Therefore, it is also free from the decrease of the electrostatic breakdown prevention effect, which could be brought from erosion during an etching. Moreover, by adding oxygen, oxygen and nitrogen, or carbon dioxide and nitrogen to the sputtering gas during the deposition, the electrostatic breakdown prevention film 2 keeps the high conductivity for a long period, performing the high effect of electrostatic breakdown prevention and contributing to the higher productivity.

After a shading film 3 is patterned by an exposure and etching, an electrostatic breakdown prevention film may be formed thereon covering fully. The structure by this would perform the electrostatic breakdown prevention function as well. Because the photomask inevitably has steps in the electrostatic breakdown prevention film 2, however, it could give rise to a problem in view of optical characteristics, such as scattering of light. Otherwise, if the film 2 is cut off at a step, the shading film 3 is not grounded well, decreasing the electrostatic breakdown prevention property. Accordingly, it is preferable to form the electrostatic breakdown prevention film 2 at the whole interface between the mask substrate 1 and the shading film as the underlayer for the shading film.

The invention claimed is:

1. A mask blank comprising
a mask substrate,
an electrostatic breakdown prevention film fully covering a front side of the mask substrate, and
a shading film formed on the electrostatic breakdown prevention film at the front side of the mask substrate,
wherein
the electrostatic breakdown prevention film is made of titanium compound or tantalum compound,
the thickness of the electrostatic breakdown prevention film is in the range of 1.5 to 3.5 nm,
the light transparent rate of the electrostatic breakdown prevention film is not less than 75% for the wavelength of light in an exposure, and
the sheet resistance of the electrostatic breakdown prevention film is not more than 100KΩ/□.

2. A mask blank as claimed in claim 1,
wherein
the electrostatic breakdown prevention film is the film formed by sputter deposition using argon with oxygen added.

3. A mask blank as claimed in claim 2,
wherein
the addition proportion of oxygen to argon is in the range of 5 to 20%.

4. A mask blank as claimed in claim 1,
wherein
the electrostatic breakdown prevention film is the film formed by sputter deposition using argon with oxygen and nitrogen added.

5. A mask blank as claimed in claim 4,
wherein
the addition proportion of oxygen to argon is in the range of 10 to 20%, and
the addition proportion of nitrogen to argon is in the range of 5 to 15%.

6. A mask blank as claimed in claim 1,
wherein
the electrostatic breakdown prevention film is the film formed by sputter deposition argon with carbon dioxide and nitrogen added.

7. A mask blank as claimed in claim 6,
wherein
the addition proportion of carbon dioxide to argon is in the range of 10 to 20%, and
the addition proportion of nitrogen to argon is in the range of 5 to 15%.

8. A photomask comprising
a mask substrate,
an electrostatic breakdown prevention film fully covering a front side of the mask substrate, and
a shading film formed and patterned on the electrostatic breakdown prevention film at the front side of the mask substrate,
wherein
the electrostatic breakdown prevention film is made of titanium compound or tantalum compound,
the thickness of the electrostatic breakdown prevention film is in the range of 1.5 to 3.5 nm,
the light transparent rate of the electrostatic breakdown prevention film is not less than 75% for the wavelength of light in an exposure, and
the sheet resistance of the electrostatic breakdown prevention film is not more than 100KΩ/□.

9. A photomask as claimed in claim 8,
wherein
the electrostatic breakdown prevention film is the film formed by sputter deposition using argon with oxygen added.

10. A photomask as claimed in claim 6,
wherein
the addition proportion of oxygen to argon is in the range of 5 to 20%.

11. A photomask as claimed in claim 8,
wherein
the electrostatic breakdown prevention film is the film formed by sputter deposition using argon with oxygen and nitrogen added.

12. A photomask as claimed in claim 11,
wherein
the addition proportion of oxygen to argon is in the range of 10 to 20%, and
the addition proportion of nitrogen to argon is in the range of 5 to 15%.

13. A photomask as claimed in claim 8,
wherein
the electrostatic breakdown prevention film is the film formed by sputter depositing argon with carbon dioxide and nitrogen added.

14. A photomask as claimed in claim 13,
wherein
the addition proportion of carbon dioxide to argon is in the range of 10 to 20%, and
the addition proportion of nitrogen to argon is in the range of 5 to 15%.

* * * * *